(12) United States Patent
Zhang et al.

(10) Patent No.: US 7,862,364 B2
(45) Date of Patent: Jan. 4, 2011

(54) CONTACT HAVING LEAD-IN ARRANGEMENT IN BODY PORTION FACILITATING SMOOTH AND RELIABLE INSERTION

(75) Inventors: Jie-Feng Zhang, Shenzhen (CN); Wen He, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/506,455

(22) Filed: Jul. 21, 2009

(65) Prior Publication Data

US 2010/0015861 A1    Jan. 21, 2010

(30) Foreign Application Priority Data

Jul. 21, 2008    (CN)    .......................... 2008 2 030155

(51) Int. Cl.
  *H01R 4/50* (2006.01)
(52) U.S. Cl. ....................... 439/342; 439/857
(58) Field of Classification Search .......... 439/856–857, 439/733.1, 342, 259
  See application file for complete search history.

(56) References Cited

U.S. PATENT DOCUMENTS

| | | | | |
|---|---|---|---|---|
| 3,665,378 A | * | 5/1972 | Hammell et al. ............ | 439/748 |
| 5,046,972 A | * | 9/1991 | Pass ........................... | 439/751 |
| 5,462,456 A | * | 10/1995 | Howell ..................... | 439/733.1 |
| 6,454,617 B1 | * | 9/2002 | Chiu .......................... | 439/857 |
| 6,461,183 B1 | | 10/2002 | Ohkita et al. | |
| 6,482,050 B1 | * | 11/2002 | Lemke et al. ............... | 439/856 |
| 6,638,119 B1 | * | 10/2003 | Chang ........................ | 439/857 |
| 6,824,414 B2 | * | 11/2004 | Whyne et al. ............... | 439/342 |
| 7,137,841 B1 | * | 11/2006 | Liao et al. ................... | 439/342 |
| 7,361,044 B1 | * | 4/2008 | Pandey et al. ............... | 439/342 |
| 2007/0111580 A1 | * | 5/2007 | Chen et al. .................. | 439/342 |

* cited by examiner

*Primary Examiner*—Michael C Zarroli
(74) *Attorney, Agent, or Firm*—Andrew C. Cheng; Wei Te Chung; Ming Chieh Chang

(57) ABSTRACT

An electrical connector includes a base defining at least a passageway extending from an upper surface of the base to a bottom surface of the base. An electrical contact is inserted into the passageway from the bottom surface and includes a retention portion engaging with an inner wall of the passageway. A lead-in chamfer is formed on an edge of the retention portion and toward the inner wall such that the lead-in chamfer is offset away an edge of the inner wall of the passageway and the contact is inserted by guiding of the chamfer.

8 Claims, 6 Drawing Sheets

CONTACT HAVING LEAD-IN ARRANGEMENT IN BODY PORTION FACILITATING SMOOTH AND RELIABLE INSERTION

BACKGROUND OF THE INVENTION

1. Field of the Invention

The present invention relates to an electrical connector, and more particularly to an electrical connector having contact terminal provided with a lead-in arrangement facilitating readily and defect-free insertion into a passageway of the electrical connector.

2. Description of the Prior Art

Electrical connector used for mounting an electrical device, such as a central processing unit (CPU) module, to a printed circuit board are well known and are commonly used in the computer industry. U.S. Pat. No. 6,461,183 issued to Ohkita et al. on Oct. 8, 2002 discloses an electrical connector for a Pin Grid Array (PGA) package. The electrical connector includes a housing positioned on a circuit board, a cover movably mounted on the housing, and a plurality of terminals received in the housing. Each terminal has a dual-beam. The cover has a plurality of holes for receiving pins of the PGA package. The cover is can be displaced to bring the pins into engagement with the contacts. Each terminal includes a base section retained in the housing and a tail extending beyond the housing for being soldered to the printed circuit board. Those beams extend from a top edge of the base section, substantially opposite to the tail. Each beam forms a spring arm. The spring arms are opposite to and spaced from each other for engaging with the corresponding pin therebetween. The beams are symmetric with respect to an imaginary plane that is vertical to the base section and coincident with a moving direction of the cover. The base section has a pair of bards on opposite sides thereof for securing the terminal to the housing.

Basically, the base portion is substantially in align with an inner wall of a passageway in which the terminal is inserted. Since there is a cutting edge in the base, and once the alignment between the base portion and the inner wall of the passageway is lost, the top edge of the base portion will then collide into the leading edge of the passageway during the insertion of the terminal. Not only will this create a problem to the insertion, but will also damage the terminal.

Therefore, it is need to find a new electrical connector having an improved electrical connector to overcome the problems mentioned above.

SUMMARY OF THE INVENTION

Accordingly, an object of the present invention is to provide an electrical connector having a contact provided with a lead-in arrangement facilitating readily and defect-free insertion into passageway of the electrical connector.

In order to achieve the object set forth, an electrical contact comprises a retention portion and a least one beam. The retention portion has a top and a bottom edges, an inner and an outer surfaces. The beam is extends upward from the upper edge of the retention portion. A lead-in chamfer is formed on the upper edge and connected with the outer surface.

In order to further achieve the object set forth, an electrical connector comprises a base defining at least a passageway extending from an upper surface to a bottom surface. An electrical contact is inserted into the passageway from the bottom surface and includes a retention portion engaging with an inner wall of the passageway. A lead-in chamfer is formed on an edge of the retention portion and toward the inner wall such that the lead-in chamfer is offset away an edge of the inner wall of the passageway and the contact is inserted by guiding of the chamfer.

DESCRIPTION OF PREFERRED EMBODIMENT

Figure 1:
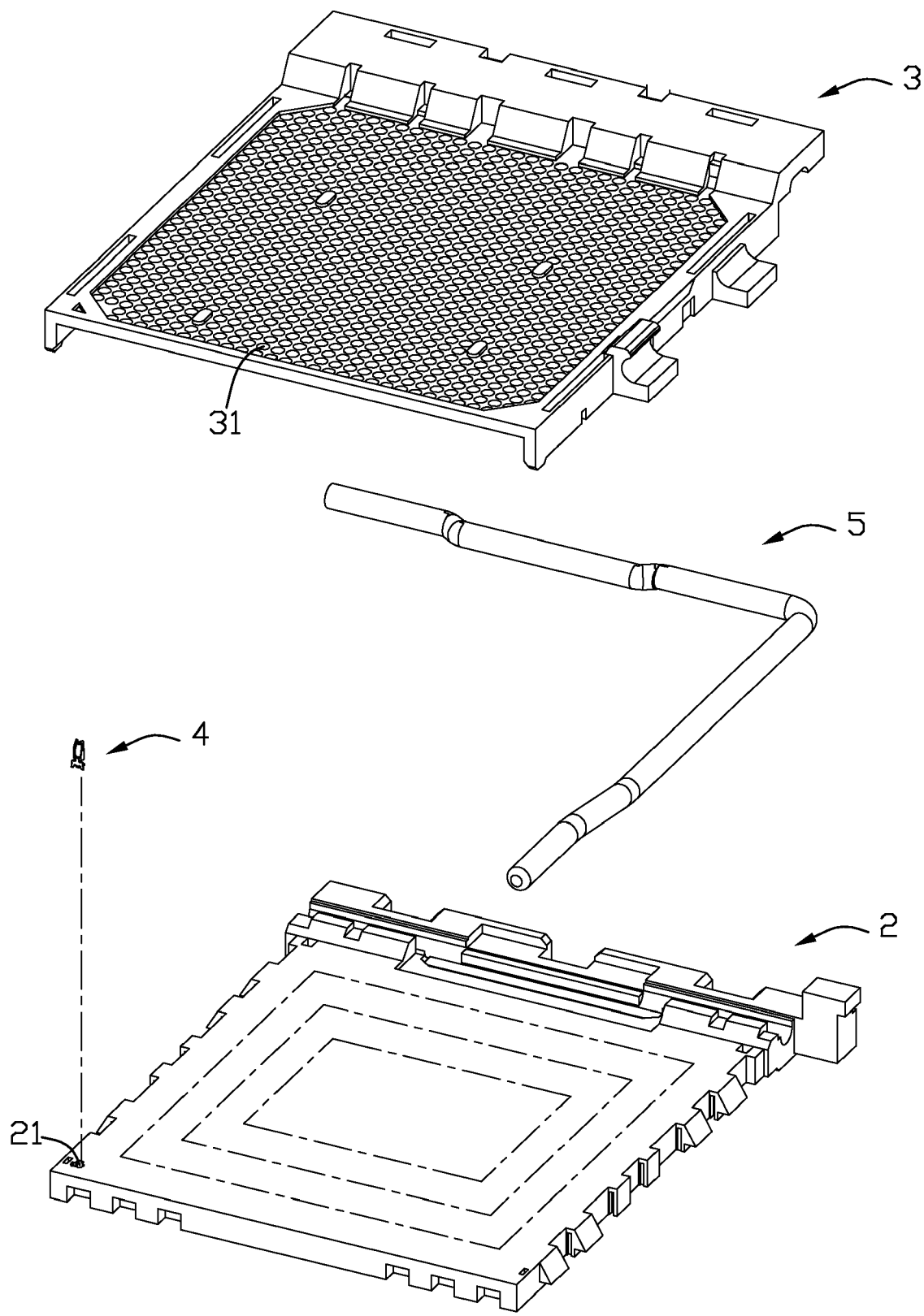
FIG. 1 is an exploded perspective view of an electrical connector according to the present invention.
Figure 2:
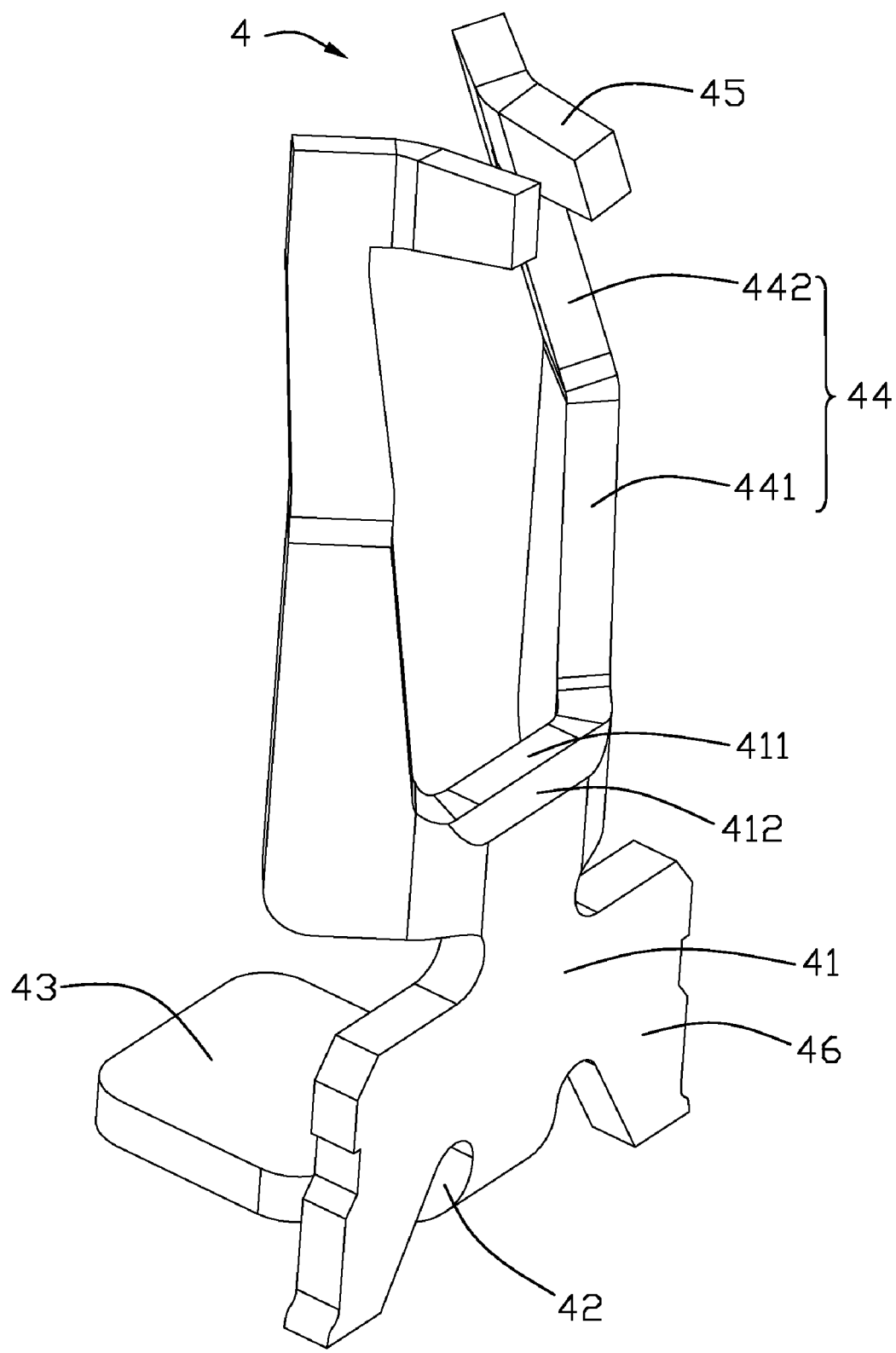
FIG. 2 is a perspective view of a contact of the electrical connector of FIG 1.
Figure 3:
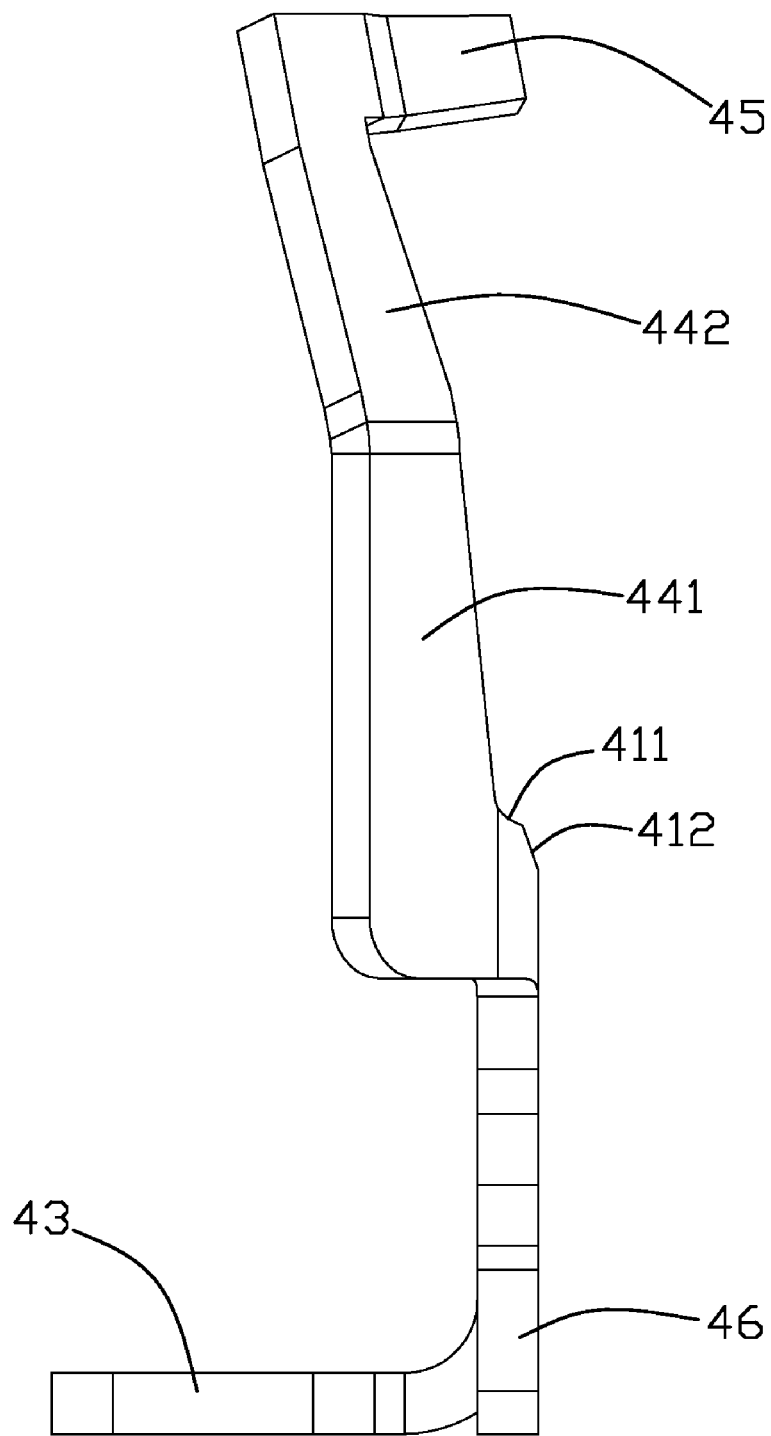
FIG. 3 is a side view of the contact of FIG. 2.
Figure 4:
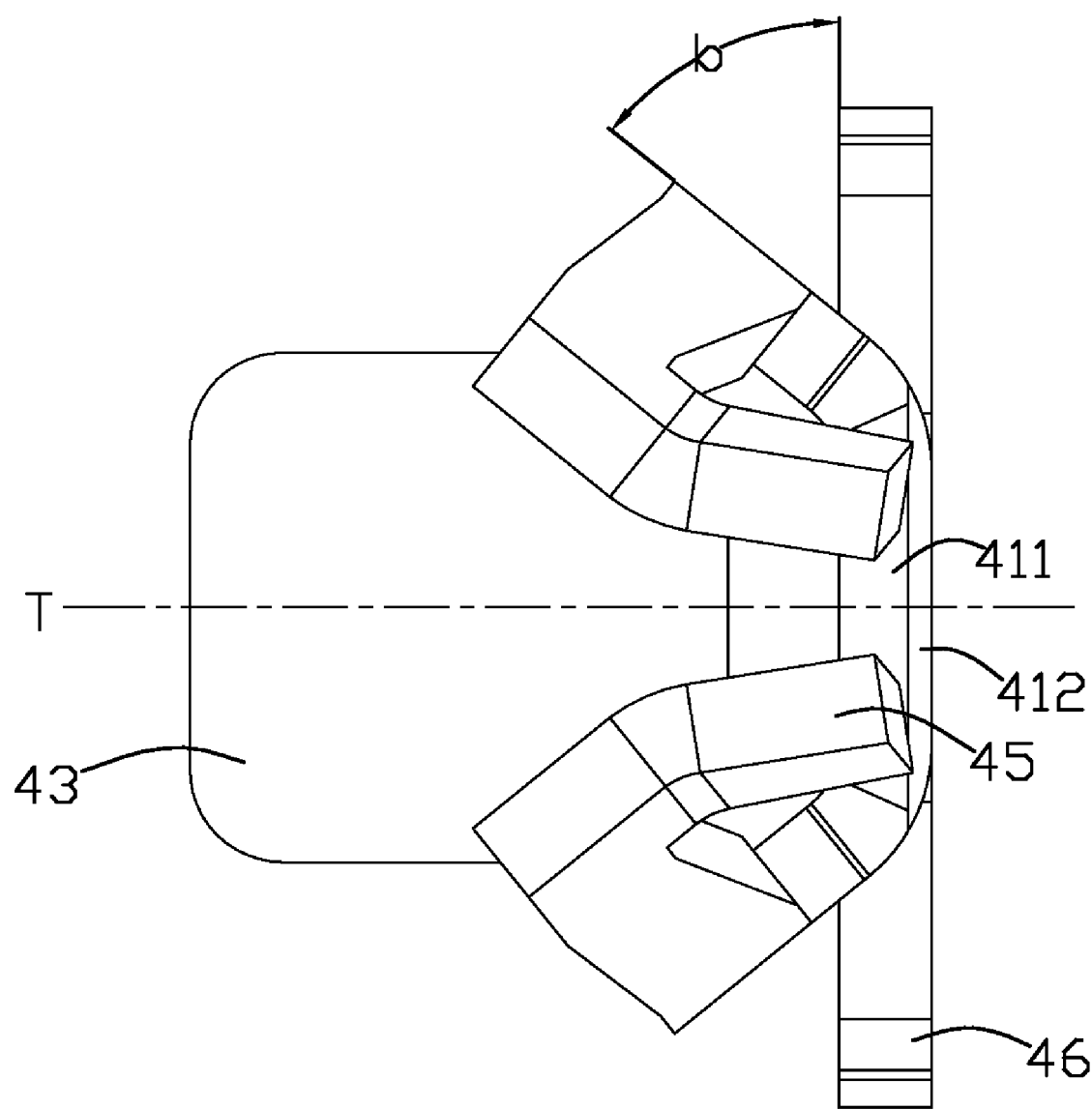
FIG. 4 is a top plan view of the contact of FIG. 2.

Reference will now be made to the drawings to describe the present invention in detail.

FIG. 1 to FIG. 6 show an electrical connector for electrically connecting a printed circuit board (not shown) to a Pin Grid Array (PGA) package (not shown). The electrical connector comprises a base 2, a cover 3 moveably mounted to the base 2, an actuator mounted between a first position and a second position, and a plurality of contacts 4 retained in the base 2. The base 2 defines a plurality of passageways 21 to receive the contacts 4, and the cover 3 has a plurality of through holes 31 corresponding to the passageways 21 and partially in align therewith. In the present embodiment, the actuator is a lever 5 which drives the cover 3 to move in a plane parallel to the underlying base 2.

The contact 4 includes a retention portion 41 received in the base 2, a soldering portion 43 extending from the retention portion 41 by a curved portion 42, and a pair of beams 44 extending upwardly from opposite sides of an top edge 411 of the retention portion 41. A solder ball (not shown) is disposed on the soldering portion 43 and adapted to be soldered on the printed circuit board (not shown). The beams 44 include a pair of first arms 441 extending from the retention portion 41 and a pair of second arms 442 bent inwardly from the first arms 441 respectively. Each first arm 441 has an angle b with respect to the retention portion 41 in a horizontal surface. The angle b is preferably 45 degrees. The contact 4 further includes a pair of mating portions 45 extending in a horizontal direction and substantially vertical to the beams 44. Those two mating portions 45 are spaced apart from each other with a gap (not labeled) defined therebetween. The gap is gradually reduced from roots of the mating portions 45 to free ends of the mating portions 45 for providing an area to allow a pin of the PGA package (not shown) passing through thereof and moving from the roots of the mating portions 45 to the free ends. The retention portion 41 has a pair of barbs 46 located on opposite sides thereof for interferentially engaging with the passageway 21 of the base 2 to firmly retain the contact 4 in the passageway 21. The barbs 46 are at a common plane with the retention portion 41 and extent downwardly to have a same level with the soldering portion 43. The beams 44, the mating portions 45 and the barbs 46 are configured symmetrically with respect to an imaginary central line T and the central line T bisects the retention portion 41 and the contact 4 itself.

The retention portion 41 has an inner surface and an outer surface abutting against an inner wall of the passageway 21. A lead-in chamfer 412 is formed on the upper edge 411 of the retention portion 41 and in transition with the outer surface. The lead-in chamfer 412 is advantageously since it avoids the collision with an edge of the passageway 21, thereby facilitating a readily and smooth insertion of the contact.

The passageways 21 are arranged in the form of a matrix in the base 2. The inner wall of the passageway 21 includes a vertical sidewall 211 vertically disposed in the passageway 21 and paralleling to the retention portion 41. An upper portion of the sidewall 211 defines an accommodating area 2110 for receiving the mating portion 45 of the contact 4, and a bottom portion of the vertical sidewall 211 forms a slant surface 2111 for conveniently inserting the contact 4. Two protrusions 213 are formed on sidewalls of the passageway 21 adjacent to the vertical sidewall 211, and each has a triangular cross section. Each protrusion 213 has a side paralleled to the vertical sidewall 211 to secure the barb 46 of the contact 4 with the vertical sidewall 211. A block 212 is disposed on an opposite side of the vertical sidewall 211 and has a planar bottom surface 2120 for blocking the soldering portion 43 to stop the contact 4 further inserting into the passageway 21.

Figure 5:
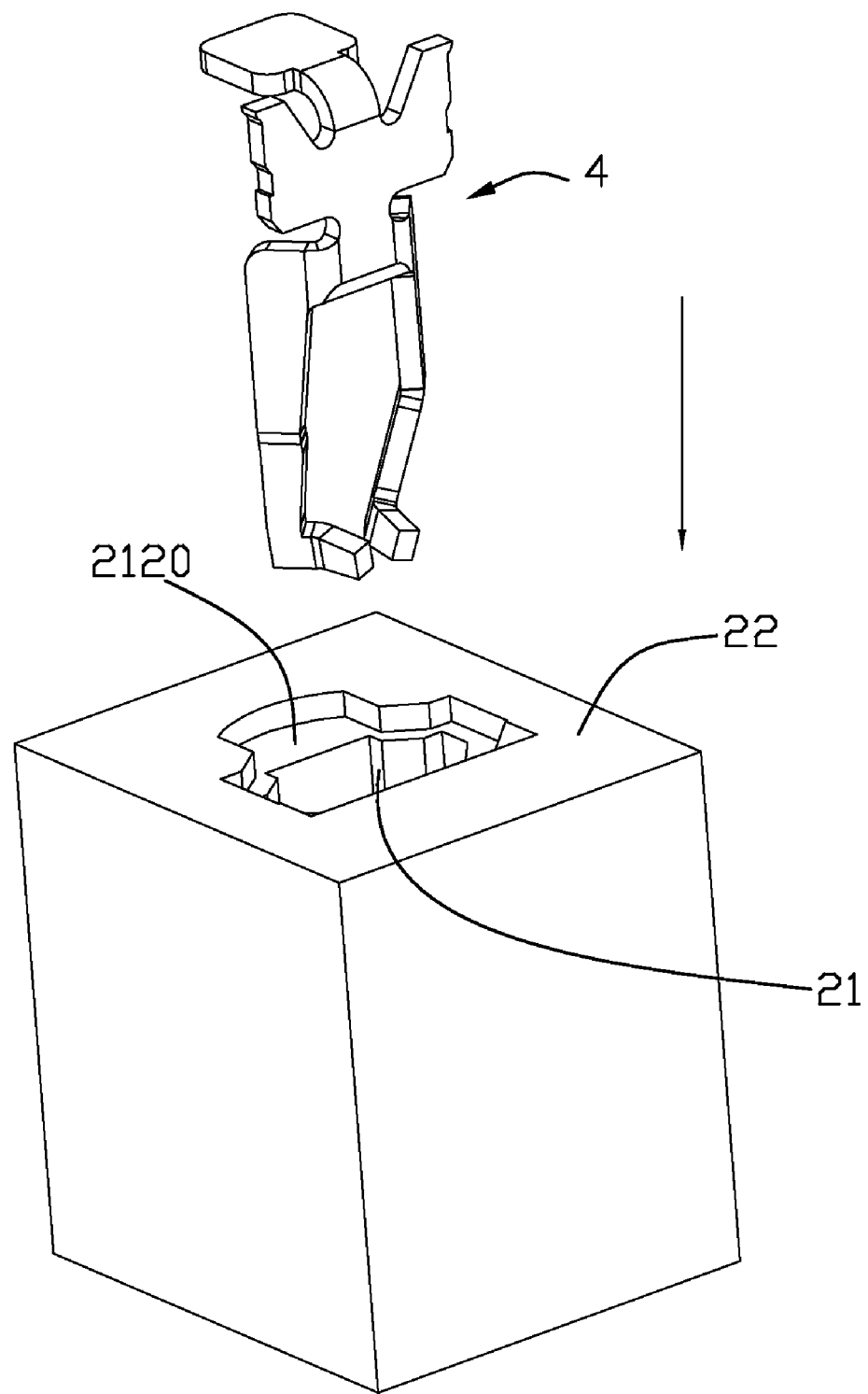
FIG. 5 is a perspective view of the contact assembling to a base of the electrical connector.
Figure 6:
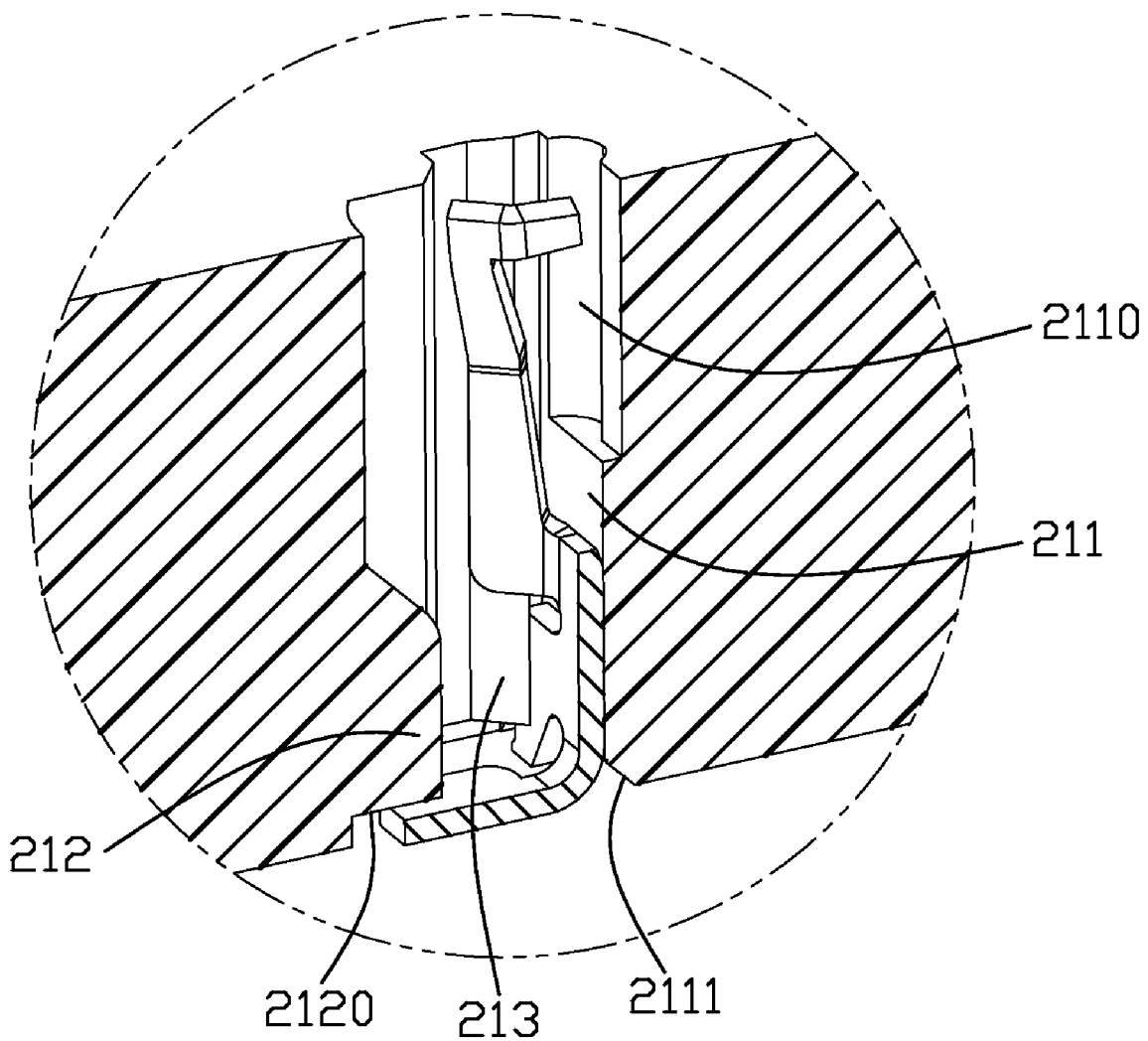
FIG. 6 is a section view, showing the contact assembled in the base.

Referring to FIGS. 5 and 6, in assembling the contact 4 to the passageway 21 of the base 2, the contact 4 needs to be inserted from a bottom surface of the base 2, because the barbs 46 connected with a contact carrier are located on a lower position so that the beams 44 located on an upper position must be inserted into the passageway 21 firstly. In assembling, the beams 44 are inserted into the passageway 21 of the bottom surface of the base 2 firstly, then the lead-in chamfer 412 guides the retention portion 41 sliding over the slant surface 2111 and into the passageway 21, lastly, the soldering portion 43 of the contact 4 are stopped by the bottom surface 2120 of the block 212. In the present invention, the lead-in chamfer 412 has a function to avoid collision with the edge of the passageway, and further reduce an insertion force for facilitating readily insertion of the contact into the passageway 21, so that the assembling rate of the contacts 4 can be enhanced.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical contact, comprising:
   a retention portion having a top and a bottom edges, an inner and an outer surfaces;
   two spaced beams extending upward from two opposite ends of the top edge of the retention portion; and
   a lead-in chamfer formed on a center part of the top edge and connected with the outer surface;
   the lead in chamfer of the contact is firstly inserted into the passageway;
   the contact comprises a soldering portion perpendicular to the retention portion;
   the retention portion has two barbs disposed at opposite sides thereof; the barbs are located at a plane coplanar with the retention portion and extend downwardly to a same level with the soldering portion;
   a pair of mating portions extends from the beams and is substantially perpendicular to the beams;
   wherein the mating portions are spaced apart from each other with a gap defined therebetween, and the gap is gradually reduced from roots of the mating portions to free ends of the mating portions.

2. The electrical contact as claimed in claim 1, wherein the beams, the mating portions and the barbs are made symmetric with respect to an imaginary central line.

3. An electrical connector, comprising: a base defining at least a passageway extending from an upper surface of the base to a bottom surface of the base;
   an electrical contact received into the passageway and including a retention portion interferentially engaging with the base; and
   a lead-in chamfer formed on an upper edge of the retention portion and toward an inner wall of the passageway such that the lead-in chamfer is offset with a bottom edge of the inner wall of the passageway when the contact is inserted into the passageway from the bottom surface, so as to guide the contact;
   the contact includes a pair of beams extending from the upper edge of the retention portion, a pair of mating portions bent from the beams, and a soldering portion extending from an opposite a bottom edge of the retention portion;
   the lead-in chamfer is formed between the beams
   wherein a vertical sidewall is formed on the inner wall and parallel to the retention portion, an accommodating area is defined at an upper portion of the vertical sidewall for receiving the mating portions of the contact, and a slant surface is formed at a lower portion of the vertical sidewall for conveniently inserting the contact.

4. The electrical connector as claimed in claim 1, wherein a block is formed at each of two opposite sides of the vertical sidewall, and has a planar bottom surface for blocking the soldering portion.

5. The electrical connector as claimed in claim 4, wherein two protrusions are formed on opposite walls adjacent to the vertical sidewall for securing the retention portion with the vertical sidewall.

6. An electrical connector for use with an electronic package, comprising:
   an insulative housing defining at least one passageway extending therethrough in a vertical direction; and
   at least one contact upwardly assembled into the passageway from a bottom face of the housing, said contact including a vertical retention plate abutting against a corresponding wall of the housing in said passageway and having barbs on two sides thereof, a pair of spring arms upwardly extending from a top portion of the retention plate; wherein
   an upper edge of the top portion located between said pair of spring arms defines a chamfered face facing outwardly toward said corresponding wall;
wherein;
   the contact includes a pair of mating portions extending essentially horizontally, said pair of mating portions being spaced from each other with a gap therebetween for receiving a pin of said electronic package, said gap being gradually reduced from roots of the mating portions to free ends of the mating portions and spaced from the upper edge of the top portion with a distance in the vertical direction; wherein
   the free ends of the mating portions are located aligned with and located above the upper edge of the top portion of the retention plate in the vertical direction.

7. The electrical connector as claimed in claim 6, wherein the pair of spring arms diverge away from each other in a direct away from the corresponding wall in a top view.

8. The electrical connector as claimed in claim 6, wherein said elongated chamfered face extends in a direction parallel to the corresponding wall in a top view.

* * * * *